(12) United States Patent
Sato et al.

(10) Patent No.: US 10,917,062 B2
(45) Date of Patent: Feb. 9, 2021

(54) METHOD OF MANUFACTURING ELECTRONIC COMPONENT AND ELECTRONIC COMPONENT

(71) Applicant: TDK CORPORATION, Tokyo (JP)

(72) Inventors: Yoshinori Sato, Tokyo (JP); Shigeyuki Doi, Tokyo (JP); Takeo Ougimoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 96 days.

(21) Appl. No.: 16/227,355

(22) Filed: Dec. 20, 2018

(65) Prior Publication Data
US 2019/0199310 A1 Jun. 27, 2019

(30) Foreign Application Priority Data

Dec. 25, 2017 (JP) ................. 2017-247338

(51) Int. Cl.
| | |
|---|---|
| H03H 1/00 | (2006.01) |
| H03H 3/00 | (2006.01) |
| H03H 7/01 | (2006.01) |
| H01G 4/232 | (2006.01) |
| H01G 4/30 | (2006.01) |
| H01F 17/00 | (2006.01) |
| H01G 4/008 | (2006.01) |
| H01G 4/38 | (2006.01) |
| H01F 41/04 | (2006.01) |
| H01G 4/40 | (2006.01) |
| H01G 4/12 | (2006.01) |

(52) U.S. Cl.
CPC ........... *H03H 1/00* (2013.01); *H01F 17/0013* (2013.01); *H01F 41/041* (2013.01); *H01F 41/043* (2013.01); *H01G 4/0085* (2013.01); *H01G 4/232* (2013.01); *H01G 4/30* (2013.01); *H01G 4/38* (2013.01); *H01G 4/40* (2013.01); *H03H 3/00* (2013.01); *H01F 2017/008* (2013.01); *H01F 2017/0026* (2013.01); *H01G 4/1227* (2013.01); *H01G 4/1245* (2013.01); *H03H 7/0115* (2013.01); *H03H 7/1758* (2013.01); *H03H 2001/0085* (2013.01)

(58) Field of Classification Search
CPC ......... H03H 2001/0085; H03H 7/0115; H03H 3/00; H03H 1/00
USPC ................................................ 333/175, 185
See application file for complete search history.

(56) References Cited

U.S. PATENT DOCUMENTS

2019/0379343 A1* 12/2019 Miyahara .............. H01F 27/362

FOREIGN PATENT DOCUMENTS

JP 2011-171341 A 9/2011

* cited by examiner

*Primary Examiner* — Rakesh B Patel
(74) *Attorney, Agent, or Firm* — Oliff PLC

(57) ABSTRACT

A method of manufacturing an electronic component includes: preparing an element body configured to have a rectangular parallelepiped shape and include a first surface serving as a mounting surface, a second surface opposing the first surface, and a third surface extending in such a way as to connect the first surface and the second surface; forming a chamfered portion chamfered between the first surface and the third surface; forming a terminal electrode on the first surface; covering the chamfered portion and the first surface with a covering member; forming a metal shield film on a part of the element body, the part including at least the second surface and the third surface and exposed from the covering member; and removing the covering member.

7 Claims, 9 Drawing Sheets

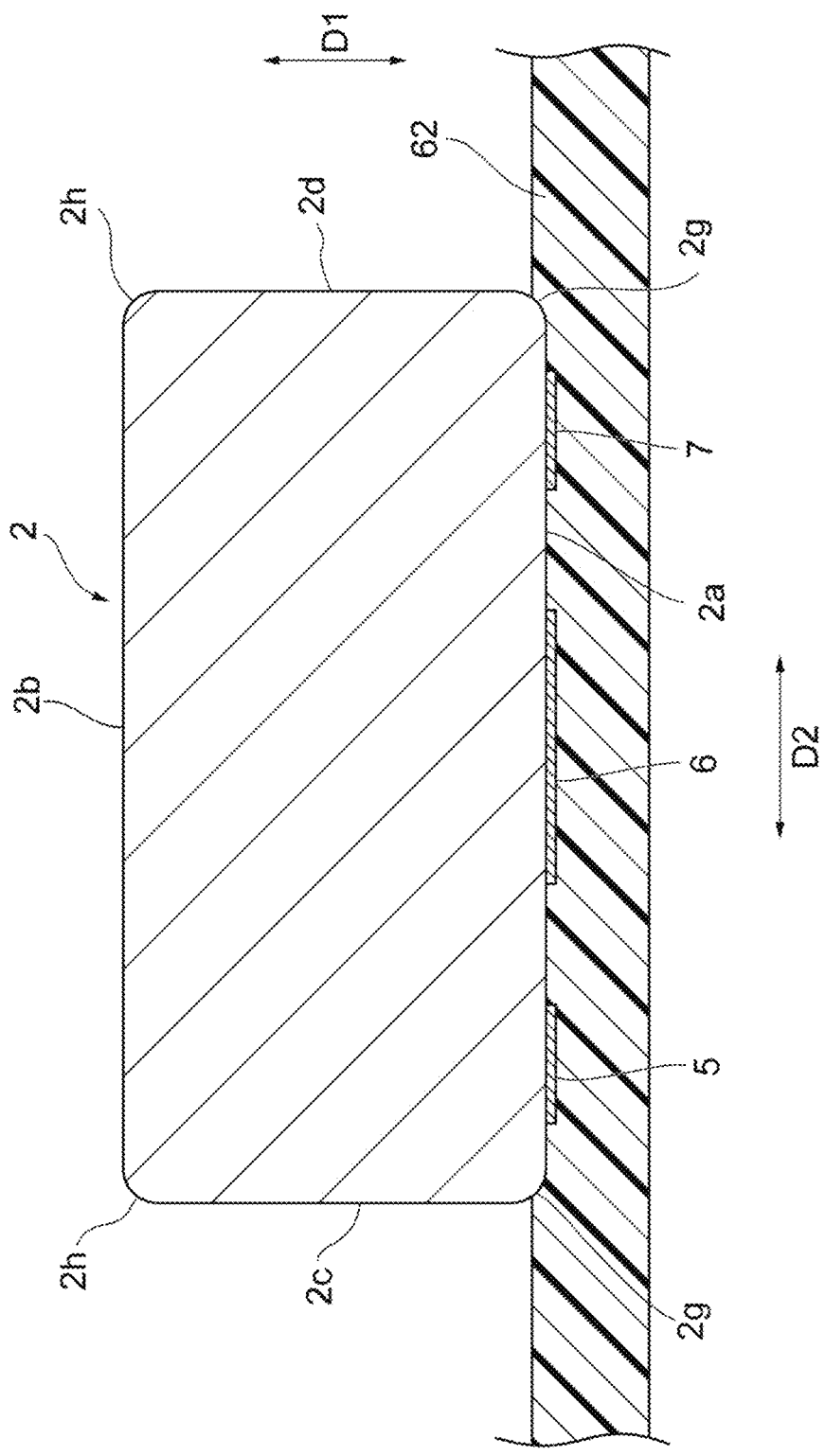

METHOD OF MANUFACTURING ELECTRONIC COMPONENT AND ELECTRONIC COMPONENT

TECHNICAL FIELD

One aspect of the present invention relates to a method of manufacturing an electronic component, and an electronic component.

BACKGROUND

For example, Japanese Unexamined Patent Publication No. 2011-171341 describes a method of manufacturing an electronic component including a ceramic element having a rectangular parallelepiped shape and an external electrode. This manufacturing method includes a step of polishing and chamfering the ceramic element by placing the ceramic element, a polishing medium, and a cushioning material in a barrel and rotating the barrel. As a result, a chamfered portion that has been chamfered is formed between the respective surfaces of the ceramic element.

SUMMARY

Meanwhile, there is a case where a metal shield film is disposed on a surface other than a mounting surface in an electronic component in which a terminal electrode is disposed on the mounting surface in order to suppress influence of electromagnetic waves or the like from the outside. In this case, it is required to dispose the metal shield film on the entire surface other than the mounting surface in order to enhance a shielding property. However, when the metal shield film is formed on the electronic component having the chamfered portion as described above, for example, by sputtering, there is a risk that the metal shield film is formed so as to extend to the mounting surface via the chamfered portion so that a short circuit may occur between the metal shield film and the terminal electrode.

One aspect of the present invention provides a method of manufacturing an electronic component, and an electronic component capable of enhancing a shielding property while suppressing a short circuit between a metal shield film and a terminal electrode.

A method of manufacturing an electronic component according to an aspect of the present invention includes: preparing an element body configured to have a rectangular parallelepiped shape and include a first surface serving as a mounting surface, a second surface opposing the first surface, and a third surface extending in such a way as to connect the first surface and the second surface; forming a chamfered portion chamfered between the first surface and the third surface; forming a terminal electrode on the first surface; covering the chamfered portion and the first surface with a covering member; forming a metal shield film on a part of the element body, the part including at least the second surface and the third surface and exposed from the covering member; and removing the covering member.

In the method of manufacturing an electronic component, the element body that includes the first surface on which the terminal electrode is formed, the second surface opposing the first surface, and the third surface extending in such a way as to connect the first surface and the second surface is prepared. That is, the first surface and the third surface are adjacent to each other. A chamfered portion that has been chamfered is formed between the first surface and the third surface which are adjacent to each other. The chamfered portion and the first surface are covered with a covering member, and a metal shield film is formed on a portion of the element body exposed from the covering member. In this manner, not only the first surface but also the chamfered portion is covered with the covering member so that the metal shield film is prevented from being formed to extend to the first surface via the chamfered portion. Therefore, a short circuit between the metal shield film and the terminal electrode can be suppressed. In addition, the metal shield film can be disposed on the entire second and third surfaces since the second surface and the third surface of the element body are exposed from the covering member. As a result, the shielding property can be enhanced.

In the covering, the entire chamfered portion may be covered with the covering member. In this case, the metal shield film is reliably prevented from being formed to extend to the first surface via the chamfered portion.

In the covering, a part of the chamfered portion may be covered with the covering member and the remaining part of the chamfered portion may be exposed from the covering member. In this case, a surface of the chamfered portion faces the same direction as the third surface in the vicinity of the third surface, and faces the same direction as the first surface as approaching the first surface. Therefore, a thickness of the metal shield film formed on the chamfered portion gradually decreases as being separated from the third surface, for example, according to sputtering. As a result, the contact area between the metal shield film and the covering member decreases so that damage to the metal shield film at the time of removing the covering member is suppressed.

In the covering, the chamfered portion and the first surface may be embedded in the covering member made of a resin having adhesiveness to be covered, and in the removing of the covering member, the adhesiveness of the resin may be lowered. In this case, the covering member can be easily removed.

In the covering, a plurality of the element bodies may be disposed on the sheet-like covering member in such a way that the chamfered portion and the first surface are covered. In this case, since the chamfered portion and the first surface of the plurality of element bodies are simultaneously covered with the sheet-like covering member, the productivity can be improved.

An electronic component according to an aspect of the present invention includes: an element body configured to have a rectangular parallelepiped shape and include a main surface; a terminal electrode disposed on only the main surface; and a metal shield film covering the element body. The element body includes four side surfaces and curved surfaces between the main surface and the side surfaces. The curved surfaces include first parts adjacent to the main surface and second parts adjacent to the side surfaces. The main surface and the first parts are exposed from the metal shield film. The second parts are covered by the metal shield film.

BRIEF DESCRIPTION OF THE DRAWINGS

FIG. 9 is a partial cross-sectional view of FIG. 7.

DETAILED DESCRIPTION

Hereinafter, preferred embodiments of the present invention will be described in detail with reference to the accompanying drawings. Incidentally, in the description of the drawings, the same or equivalent elements will be denoted by the same reference signs, and redundant descriptions thereof will be omitted.

Figure 1:
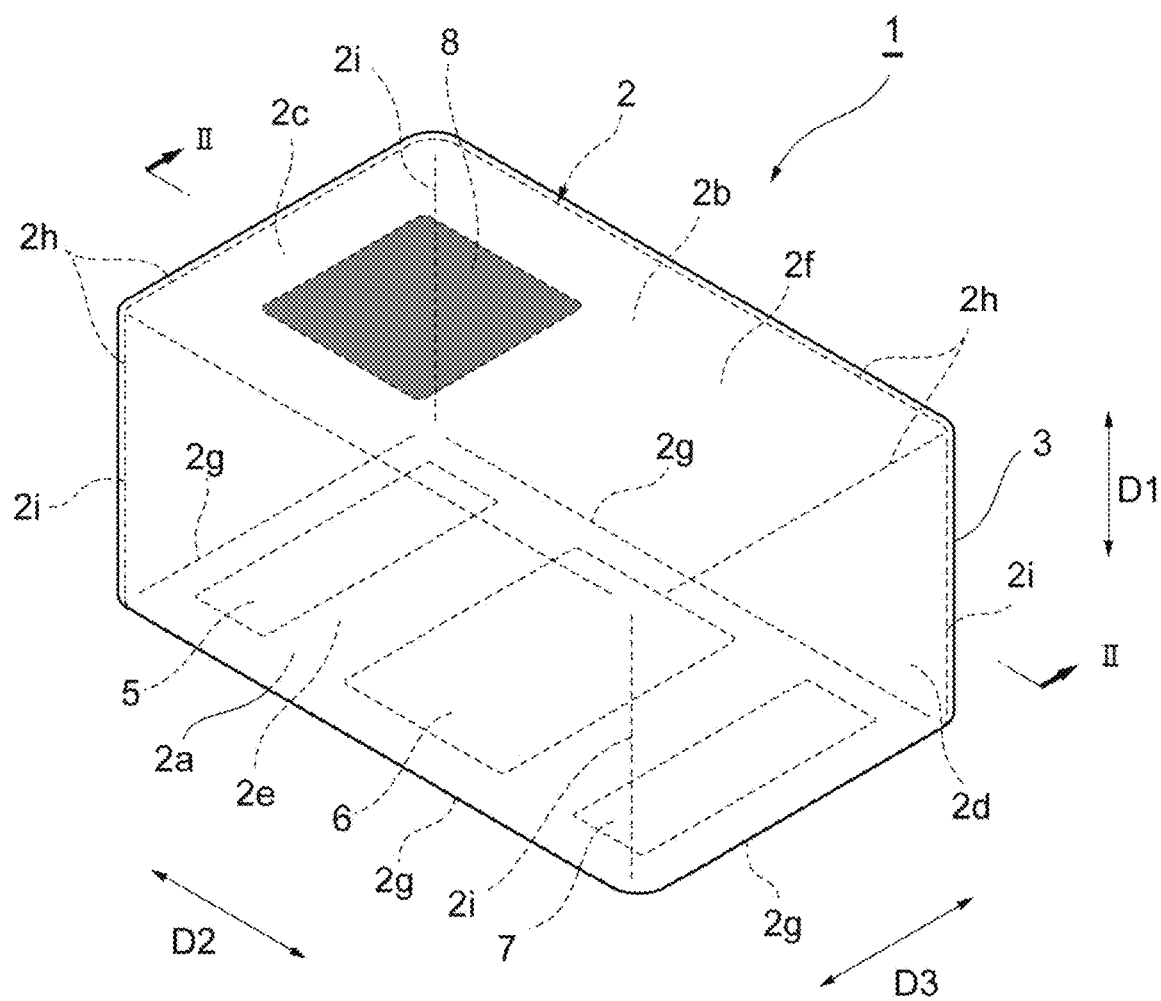
FIG. 1 is a perspective view illustrating an electronic component according to one embodiment.
Figure 2:
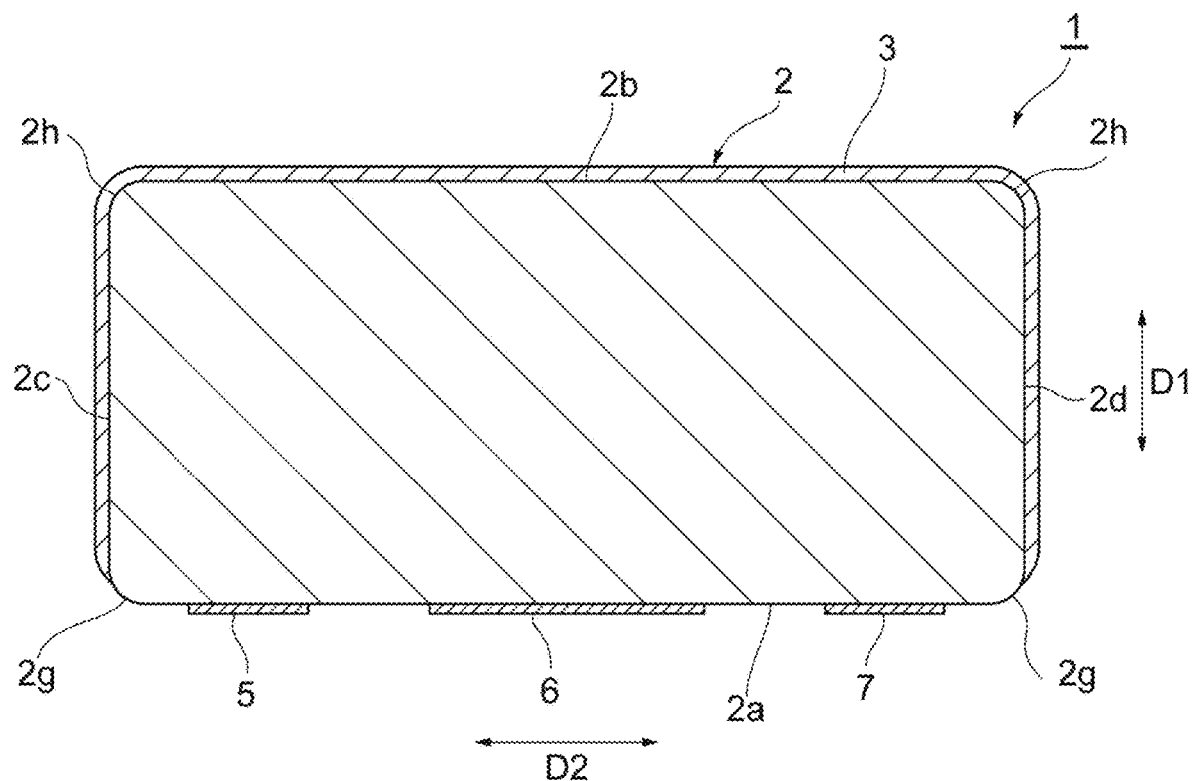
FIG. 2 is a cross-sectional view taken along line II-II of FIG. 1.

FIG. 1 is a perspective view illustrating an electronic component according to one embodiment; FIG. 2 is a cross-sectional view taken along line II-II of FIG. 1; As illustrated in FIGS. 1 and 2, an electronic component 1 includes an element body 2, a metal shield film 3, a terminal electrode 5, a terminal electrode 6, a terminal electrode 7, and a mark 8. The electronic component 1 is, for example, a multilayer electronic component in which a plurality of insulator layers is laminated. In the present embodiment, the electronic component 1 will be described by exemplifying a multilayer high-pass filter. In FIGS. 1 and 2, an internal electrode and the like disposed inside the element body 2 are not illustrated.

The element body 2 has a rectangular parallelepiped shape. The rectangular parallelepiped shape includes a rectangular parallelepiped shape of which corner portions and ridge portions are chamfered, and a rectangular parallelepiped shape of which corner portions and ridge portions are rounded. Outer surfaces of the element body 2 include a pair of main surfaces 2a and 2b opposing each other, a pair of side surfaces 2c and 2d extending in such a way as to connect the pair of main surfaces 2a and 2b and opposing each other, and a pair of side surfaces 2e and 2f extending in such a way as to connect the pair of main surfaces 2a and 2b and opposing each other. For example, when mounting the electronic component 1 on another electronic device (not illustrated) (for example, a circuit board or an electronic component), the main surface 2a is defined as, mounting surface that opposes the other electronic device.

A direction D1 in which the pair of main surfaces 2a and 2b oppose each other, a direction D2 in which the pair of side surfaces 2c and 2d oppose each other, and a direction D3 in which the pair of side surfaces 2e and 2f oppose each other are substantially orthogonal to each other. A length of the element body 2 in the direction D1 is, for example, 0.8 mm, a length of the element body 2 in the direction D2 is, for example, 2 mm, and a length of the element body 2 in the direction D3 is, for example, 1.25 mm.

The element body 2 has a plurality of (here, four) chamfered portions 2g, a plurality of (here, four) chamfered portions 2h, and a plurality of (here, four) chamfered portions 2i. The chamfered portion 2g, the chamfered portion 2h, and the chamfered portion 2i are formed by chamfering the corner portions and ridge portions of the element body 2. The chamfered portion 2g, the chamfered portion 2h and the chamfered portion 2i are rounded in such a way as to be curved. Each radius of curvature of the chamfered portion 2g, the chamfered portion 2h and the chamfered portion 2i is, for example, 15 μm.

The chamfered portion 2g extends along an outer edge of the main surface 2a. The chamfered portions 2g are the ridge portions positioned, respectively, between the main surface 2a and the side surface 2c, between the main surface 2a and the side surface 2d, between the main surface 2a and the side surface 2e, and between the main surface 2a and the side surface 2f. The chamfered portion 2g between the main surface 2a and the side surface 2c extends along the direction D3. The chamfered portion 2g between the main surface 2a and the side surface 2d extends along the direction D3. The chamfered portion 2g between the main surface 2a and the side surface 2e extends along the direction D2. The chamfered portion 2g between the main surface 2a and the side surface 2f extends along the direction D2.

The chamfered portion 2h extends along an outer edge of the main surface 2b. The chamfered portions 2h are the ridge portions positioned, respectively, between the main surface 2b and the side surface 2c, between the main surface 2b and the side surface 2d, between the main surface 2b and the side surface 2e, and between the main surface 2b and the side surface 2f. The chamfered portion 2h between the main surface 2b and the side surface 2c extends along the direction D3. The chamfered portion 2h between the main surface 2b and the side surface 2d extends along the direction D3. The chamfered portion 2h between the main surface 2b and the side surface 2e extends along the direction D2. The chamfered portion 2h between the main surface 2b and the side surface 2f extends along the direction D2.

The chamfered portion 2i extends in such a way as to connect the main surface 2a and the main surface 2b. The chamfered portions 2i are the ridge portions positioned, respectively, between the side surface 2c and the side surface 2e, between the side surface 2e and the side surface 2d, between the side surface 2d and the side surface 2f, and between the side surface 2f and the side surface 2c. The chamfered portion 2i extends along the direction D1.

Figure 3:
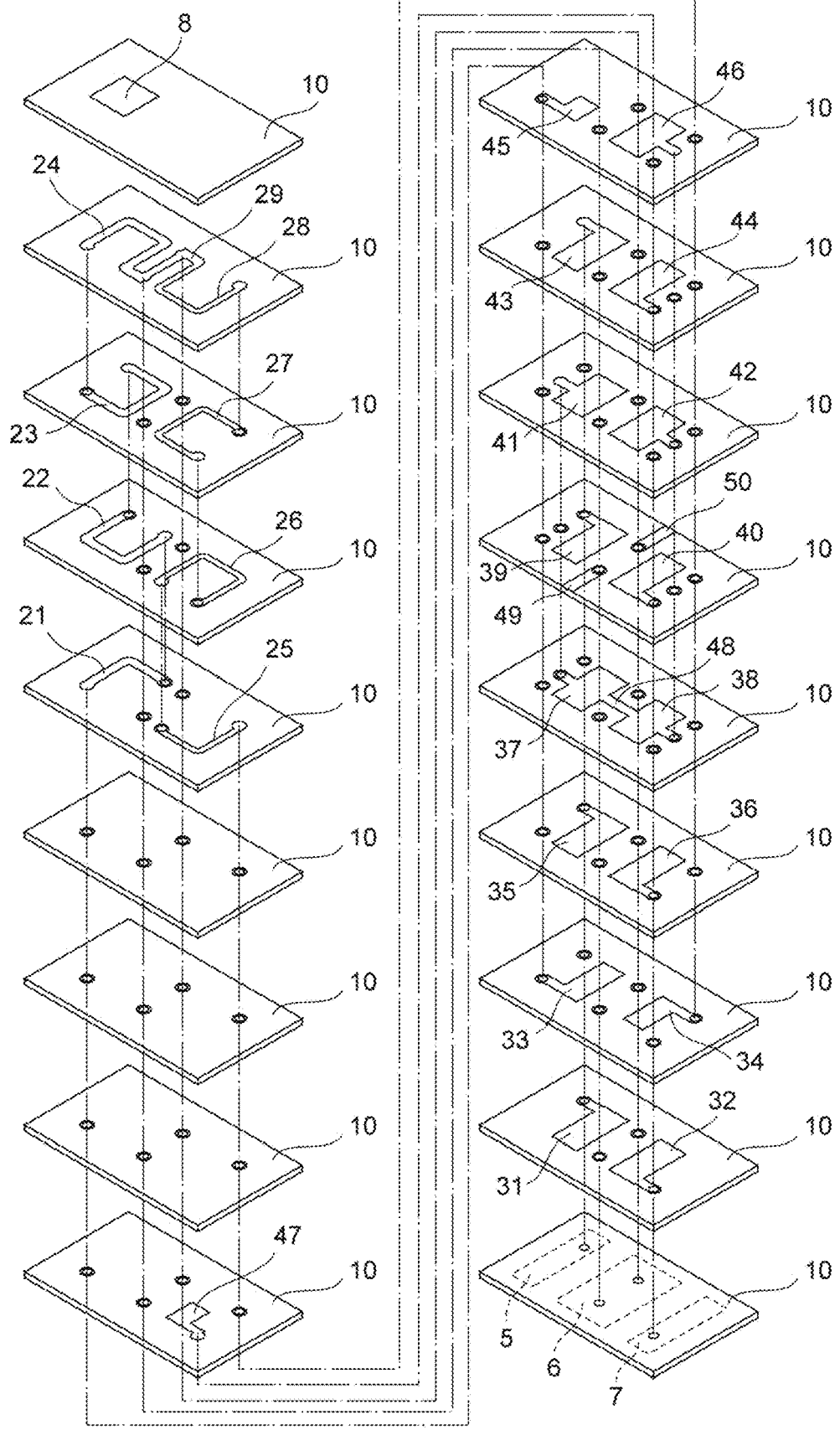
FIG. 3 is an exploded perspective view of an element body.

The element body 2 is configured by laminating a plurality of insulator layers 10 (see FIG. 3). The respective insulator layers 10 are laminated in the direction D1. That is, the laminating direction of the respective insulator layers 10 coincides with the direction D1. Each of the insulator layers 10 has a substantially rectangular shape in a plan view. In the actual element body 2, the plurality of insulator layers 10 are integrated in such a way that no boundaries between the layers can be visually recognized. Each of the insulator layers 10 is configured using a sintered body of a ceramic green sheet containing, for example, a dielectric material (a $BaTiO_3$-based material, a $Ba(Ti, Zr)O_3$ based material, a $(Ba, Ca)TiO_3$ based material, a glass material, an alumina material, or the like).

The metal shield film 3 is disposed on at least the main surface 2b and the side surfaces 2c, 2d, 2e, and 2f. The metal shield film 3 is also disposed on the chamfered portion 2h and the chamfered portion 2i. The metal shield film 3 is disposed so as to be separated from the main surface 2a on which the terminal electrodes 5 to 7 are disposed and a part of the chamfered portion 2g. The main surface 2a on which the terminal electrodes 5 to 7 are disposed and the part of the chamfered portion 2g are not covered with the metal shield film 3 but are exposed from the metal shield film 3. The metal shield film 3 integrally covers the whole of the main surface 2b, the side surfaces 2c, 2d, 2e, and 2f, and the chamfered portions 2h and 2i, and the remaining part of the chamfered portion 2g without any gap. Here, the part of the chamfered portion 2g is a part of the chamfered portion 2g adjacent to the main surface 2a, and the remaining part of the chamfered portion 2g is a part adjacent to the side surfaces 2c, 2d, 2e, and 2f in the chamfered portion 2g.

For example, a thickness of the metal shield film 3 on the main surface 2b is thicker than a thickness of the metal shield film 3 on the side surfaces 2c, 2d, 2e, and 2f. The thickness of the metal shield film 3 on the main surface 2b is, for example, 4.8 μm. The thickness of the metal shield film 3 on the side surfaces 2c, 2d, 2e, and 2f is, for example, 2.4 μm. A thickness of the metal shield film 3 in the remaining part of the chamfered portion 2g is thinner than the thickness of the metal shield film 3 on the side surfaces 2c, 2d, 2e and 2f. The thickness of the metal shield film 3 in the remaining part of the chamfered portion 2g is equal to the thickness of the metal shield film 3 in the side surfaces 2c, 2d, 2e, and 2f in the vicinities of the side surfaces 2c, 2d, 2e and 2f, and becomes thinner as being separated from the side surfaces 2c, 2d, 2e, and 2f.

The metal shield film 3 is a metal film that is made of metal (for example, Cu or Ag). In the present embodiment, the metal shield film 3 has a layer structure formed of an SUS (stainless steel) layer functioning as a base layer, a Cu layer functioning as a main body of the metal shield film 3, and a SUS layer functioning as a protective layer. A thickness of the Cu layer on the main surface 2b is, for example, 4 μm. A thickness of the Cu layer on the side surfaces 2c, 2d, 2e, and 2f is, for example, 2 μm. A thickness of the base layer (SUS layer) on the main surface 2b is, for example, 0.4 μm. The thickness of the base layer (SUS layer) on the side surfaces 2c, 2d, 2e, and 2f is, for example, 0.2 μm. The thickness of the protective layer (SUS layer) on the main surface 2b is, for example, 0.4 μm. The thickness of the protective layer (SUS layer) on the side surfaces 2c, 2d, 2e, and 2f is, for example, 0.2 μm.

The respective terminal electrodes 5 to 7 are disposed on the main surface 2a of the element body 2. The terminal electrodes 5 to 7 are separated from each other in the direction D2. On the main surface 2a, the terminal electrode 6 is positioned in a center portion in the direction D2, the terminal electrode 5 is positioned to be closer to the side surface 2c side than the terminal electrode 6, and the terminal electrode 7 is positioned to be closer to the side surface 2d side than the terminal electrode 6. Each of the terminal electrodes 5 to 7 has a rectangular shape when viewed from a direction (the direction D1) orthogonal to the main surface 2a. Lengths of the terminal electrodes 5 to 7 in the direction D3 are equal to each other. The length of the terminal electrode 5 in the direction D2 is equal to the length of the terminal electrode 7 in the direction D2. The length of the terminal electrode 6 in the direction D2 is longer than the length of each of the terminal electrode 5 and the terminal electrode 7 in the direction D2. The length of the terminal electrode 6 in the direction D2 is about twice the length of each of the terminal electrode 5 and the terminal electrode 7 in the direction D2. Each of the terminal electrodes 5 to 7 is separated from the outer edge of the main surface 2a. Each of the terminal electrodes 5 to 7 is separated from the chamfered portion 2g.

Each of the terminal electrodes 5 to 7 includes, for example, a sintered metal layer formed by firing a conductive paste applied to the main surface 2a. The conductive paste contains, for example, a metal component (for example, Ag or Pd), a glass component, an organic binder, and an organic solvent. The conductive paste is applied to the main surface 2a by screen printing, for example. Each of the terminal electrodes 5 to 7 further includes, for example, a plating layer formed on a surface of the sintered metal layer. The plating layer has, for example, a layer structure including a Ni plating layer and an Au plating layer, a layer structure including a Ni plating layer and a Sn plating layer, or a layer structure including a Cu plating layer, a Ni plating layer, and a Sn plating layer.

The mark 8 is disposed to identify a mounting direction of the electronic component 1. The mark 8 is disposed on the main surface 2b. The mark 8 is disposed to be closer to the side surface 2c than the center portion of the main surface 2b in the direction D2. The mark 8 is made of, for example, a material different from that of the element body 2, and has a surface roughness different from that of the element body 2. The metal shield film 3 is formed to follow the surface roughness of the element body 2 and the mark 8. Therefore, a light reflection state differs between a part of the metal shield film 3 formed on the surface of the element body 2 and a part thereof formed on a surface of the mark 8. As a result, it is possible to identify the mark 8 even from the outside of the metal shield film 3. For example, a thickness of the mark 8 is set to a thickness that is not removed by barrel polishing to be described later.

Figure 4:
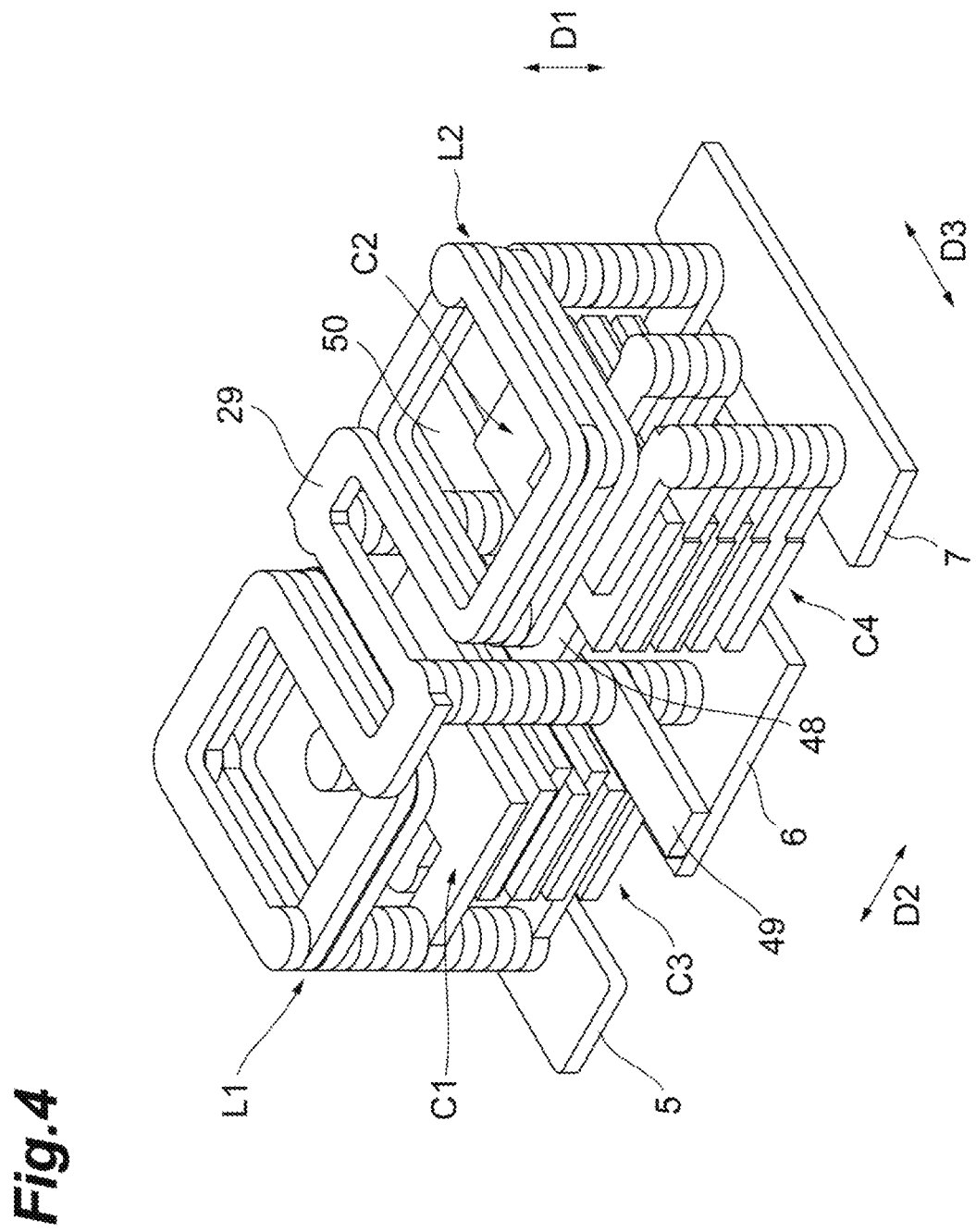
FIG. 4 is a perspective view illustrating a configuration inside the element body.

FIG. 3 is an exploded perspective view of an element body; FIG. 4 is a perspective view illustrating a configuration inside the element body; As illustrated in FIGS. 3 and 4, the electronic component 1 has a plurality of coil conductors 21 to 28 and a connection conductor 29. The coil conductors 21, 22, 23, and 24 are disposed at mutually different positions (layers) in the direction D1. The coil conductors 21, 22, 23, and 24 are connected to each other in the direction D1 to form an inductor L1. The coil conductors 25, 26, 27, and 28 are disposed at mutually different positions (layers) in the direction D1. The coil conductors 25, 26, 27 and 28 are connected to each other in the direction D1 to form an inductor L2.

The connection conductor 29 connects the inductor L1 and the inductor L2 by connecting the coil conductor 24 and the coil conductor 28. When viewed from the direction D1, the connection conductor 29 is disposed in the center portion in the direction D2, the inductor L1 is disposed to be closer to the side surface 2c than the connection conductor 29, and the inductor L2 is disposed to be closer to the side surface 2d than the connection conductor 29.

The coil conductors 21 and 25 are disposed at the same position (layer) in the direction D1. The coil conductors 22 and 26 are disposed at the same position (layer) in the direction D1. The coil conductors 23 and 27 are disposed at the same position (layer) in the direction D1. The coil conductors 24 and 28 and the connection conductor 29 are disposed at the same position (layer) in the direction D1.

The electronic component 1 has internal electrodes 31 to 47 and connection conductors 48 to 50. The internal electrodes 35, 37, 39, 41, and 43 are disposed to oppose each other with the insulator layer 10 interposed therebetween, thereby forming a capacitor C1. The internal electrodes 36, 38, 40, 42, 44, 46, and 47 are disposed to oppose each other with the insulator layer 10 interposed therebetween, thereby forming a capacitor C2. The internal electrodes 31, 33, 35, 43, and 45 are disposed to oppose each other with the insulator layer 10 interposed therebetween, thereby forming a capacitor C3. The internal electrodes 32, 34, and 36 are disposed to oppose each other with the insulator layer 10 interposed therebetween, thereby forming a capacitor C4.

The internal electrodes 31 and 32 are disposed at the same position (layer) in the direction D1. The internal electrodes 33 and 34 are disposed at the same position (layer) in the direction D1. The internal electrodes 35 and 36 are disposed at the same position (layer) in the direction D1. The internal electrodes 37 and 38 and the connection conductor 48 are disposed at the same position (layer) in the direction D1.

The internal electrodes 39 and 40 and the connection conductors 49 and 50 are disposed at the same position (layer) in the direction D1. The internal electrodes 41 and 42 are disposed at the same position (layer) in the direction D1. The internal electrodes 43 and 44 are disposed at the same position (layer) in the direction D1. The internal electrodes 45 and 46 are disposed at the same position (layer) in the direction D1.

The internal electrodes 31 and 32, the internal electrodes 33 and 34, the internal electrodes 35 and 36, the internal electrodes 37 and 38, the internal electrodes 39 and 40, the internal electrodes 41 and 42, the internal electrodes 43 and 44, the internal electrodes 45 and 46, and the internal electrode 47 are disposed at mutually different positions (layers) in the direction D1.

The internal electrodes 31, 35, 39, and 43 are connected to the terminal electrode 5 through a through-hole conductor. The internal electrodes 32, 36, 40, 44, and 47 are connected to the terminal electrode 7 through a through-hole conductor. The internal electrodes 37 and 41 are connected to each other through a through-hole conductor. The internal electrodes 38, 42, and 46 are connected to each other through a through-hole conductor.

The connection conductor 48 connects the capacitor C1 and the capacitor C2 by connecting the internal electrode 37 and the internal electrode 38. The connection conductor 49 is exposed to the side surface 2e and has one end portion connected to the metal shield film 3 and the other end portion connected to the terminal electrode 6 through the through-hole conductor. The connection conductor 50 is exposed to the side surface 2f and has one end portion connected to the metal shield film 3 and the other end portion connected to the terminal electrode 6 through the through-hole conductor. The metal shield film 3 and the terminal electrode 6 are connected to each other through the connection conductors 49 and 50 and the through-hole conductor.

The internal electrodes 33 and 45 and the end portion of the coil conductor 21 are connected to each other through a through-hole conductor. The internal electrode 34 and an end portion of the coil conductor 25 are connected to each other through a through-hole conductor.

The coil conductors 21 to 28, the connection conductor 29, the internal electrodes 31 to 47, the connection conductors 48 to 50, and the through-hole conductors include a conductive material (for example, Ag or Pd). The coil conductors 21 to 28, the connection conductor 29, the internal electrodes 31 to 47, the connection conductors 48 to 50, and the through-hole conductors are configured using a sintered body of a conductive paste containing a conductive material (for example, Ag powder or Pd powder).

Figure 5:
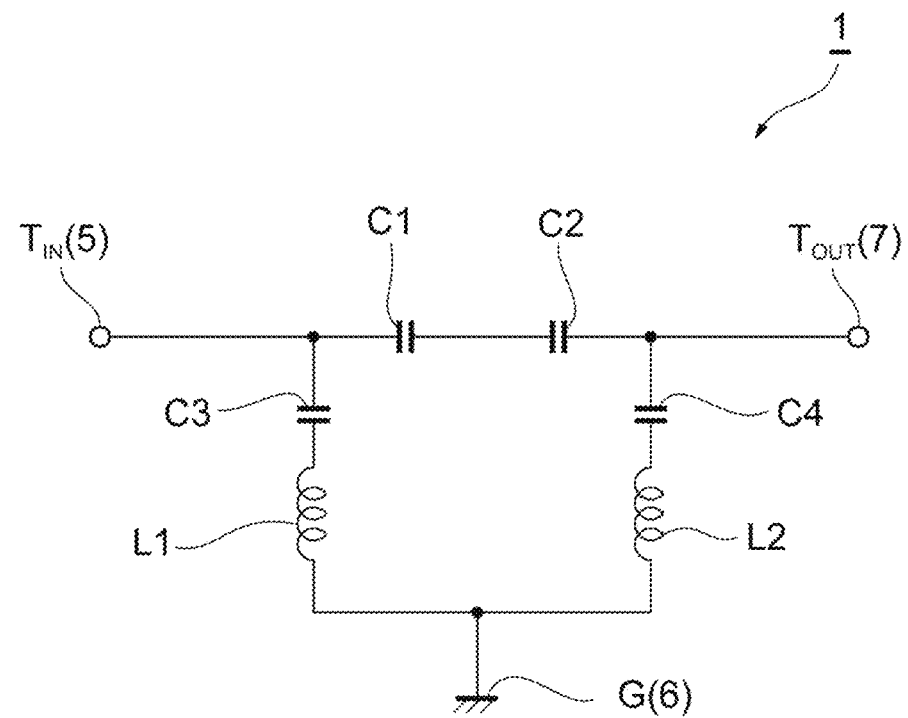
FIG. 5 is a diagram illustrating an equivalent circuit of an electronic component.

FIG. 5 is a diagram illustrating an equivalent circuit of an electronic component; In the electronic component 1, the terminal electrode 5 forms an input terminal $T_{IN}$ to which a signal is input, the terminal electrode 6 forms a ground terminal G, and the terminal electrode 7 forms an output terminal $T_{OUT}$ from which a signal is output as illustrated in FIG. 5. The capacitor C1 and the capacitor C2 are connected in series between the input terminal $T_{IN}$ and the output terminal $T_{OUT}$. One end of the capacitor C1 is connected to the input terminal $T_{IN}$. The other end of the capacitor C1 is connected to one end of the capacitor C2. The other end of the capacitor C2 is connected to the output terminal $T_{OUT}$.

The capacitor C3, the inductor L1, the inductor L2, and the capacitor C4 are connected in series in this order. The capacitor C3, the inductor L1, the inductor L2, and the capacitor C4 are connected in parallel with the capacitor C1 and the capacitor C2. One end of the capacitor C3 is connected to the input terminal $T_{IN}$. The other end of the capacitor C3 is connected to one end of the inductor L1. The other end of the inductor L1 is connected to one end of the inductor L2. The other end of the inductor L2 is connected to one end of the capacitor C4. The other end of the capacitor C4 is connected to the output terminal $T_{OUT}$. The other end of the inductor L1 and the one end of the inductor L2 are connected to the ground terminal G.

Next, a method of manufacturing the electronic component 1 will be described. The method of manufacturing the electronic component 1 includes the following steps.

Figure 6:
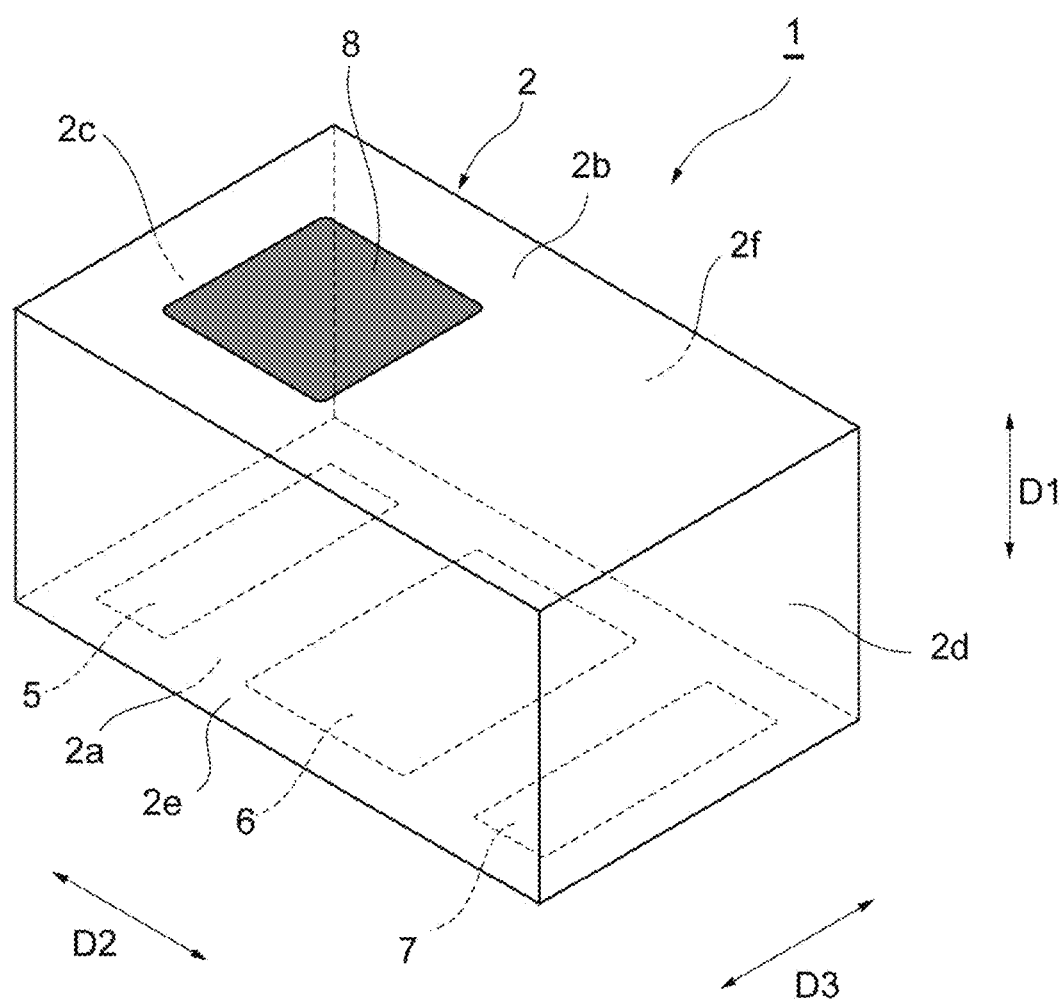
FIG. 6 is a perspective view for describing a step of preparing the element body.

First, a step of preparing the element body 2 is performed. Specifically, first, a green sheet is prepared and binder removal processing is performed. Next, a conductive paste is applied (supplied) on the green sheet to form conductor patterns corresponding to the sintered metal layer of the terminal electrodes 5 to 7, the coil conductors 21 to 28, the connection conductor 29, the internal electrodes 31 to 47, the connection conductors 48 to 50, and the through-hole conductors. On the other hand, a paste containing a constituent material of the mark 8 is applied (supplied) on the green sheet to form a pattern corresponding to the mark 8. Subsequently, the green sheets are laminated to produce a laminate green. Next, the laminate green is pressed with a predetermined pressure in the laminating direction while being heated at a predetermined temperature to obtain a laminate substrate. Subsequently, the laminate substrate is cut into chips. As a result, the plurality of element bodies 2 is prepared. The element body 2 prepared in this step is in a state before firing and a state where the chamfered portions 2g, 2h, and 2i are not formed as illustrated in FIG. 6. The element bodies 2 include the element bodies 2 in both the states before and after firing and include the element bodies 2 in both the states before and after chamfering.

Next, a step (chamfering step) of forming the chamfered portions 2g, 2h, and 2i chamfered between the main surface 2a and each of the side surfaces 2c, 2d, 2e, and 2f is performed. Specifically, the element body 2, the polishing medium, and the cushioning material are placed into a barrel, and the barrel is rotated to polish (barrel-polish) the element body 2 to perform chamfering.

Next, a step of firing the element body 2 is performed. In this step, the element body 2 is fired under predetermined conditions.

Next, a plating layer is formed on a surface of the sintered metal layer by electrolytic plating or electroless plating. As a result, the terminal electrodes 5 to 7 including the sintered metal layers and the plating layers are formed.

Figure 7:
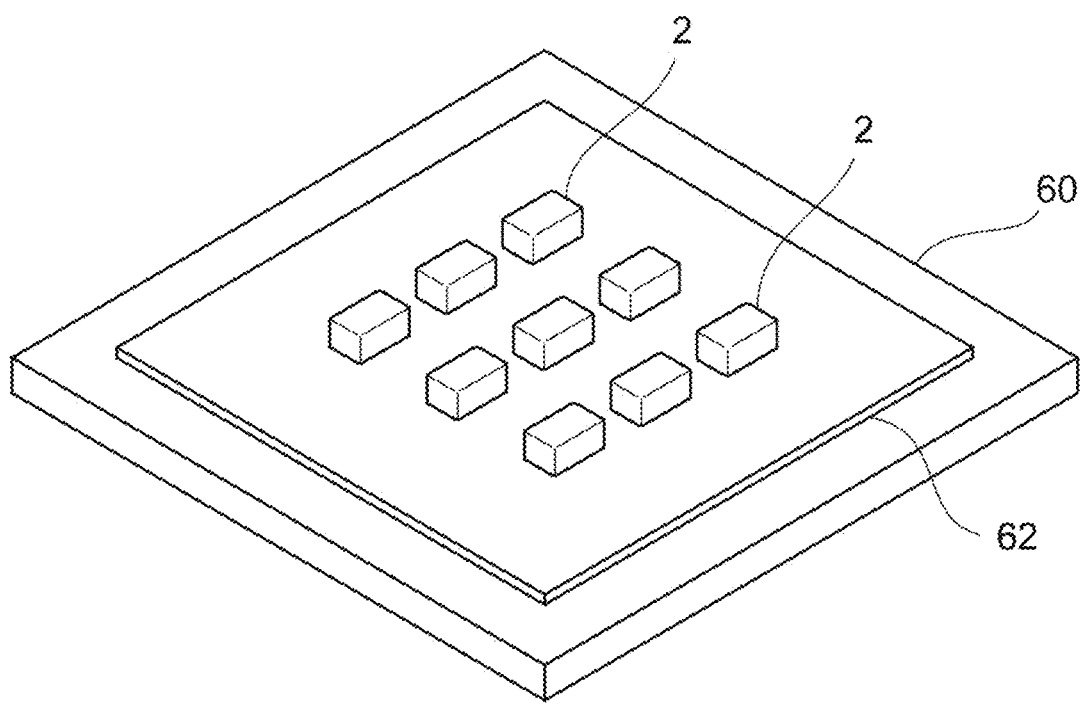
FIG. 7 is a perspective view for describing a covering step.

Next, a step of preparing a sheet-like covering member 62 disposed on a plate member 60 and covering the chamfered portion 2g and the main surface 2a of the element body 2 with the covering member 62 is performed as illustrated in FIGS. 7 and 9. FIG. 9 does not illustrate the plate member 60. The plate member 60 is a metal plate made of SUS, for example. A thickness of the plate member 60 is, for example, 3 mm. The covering member 62 is formed in the sheet shape and has an area that allows the plurality of element bodies 2 to be disposed while being separated from each other. The covering member 62 is configured to include, for example, a base material and adhesive layers disposed on both surfaces of the base material. A thickness of the adhesive layer is, for example, 100 μm. The adhesive layer is made of a resin having adhesiveness. The adhesive layer is made of, for example, a UV curing resin, has adhesiveness before being subjected to UV irradiation, and adheres to the element body 2. The adhesive layer is cured by UV irradiation, and the adhesiveness is lowered. The adhesiveness of at least a surface of the adhesive layer adhering to the element body 2 is lowered by UV irradiation.

The adhesive layer may be made of, for example, a resin having a heat-peelable property. In this case, the adhesive layer has the adhesiveness at room temperature and adheres to the element body 2. When the adhesive layer is heated, the adhesiveness of at least the surface adhering to the element body 2 is lowered. The adhesive layer may be, for example, a heat-foamable adhesive layer made of a resin of which adhesiveness is lowered when foaming by heating. The adhesive layer may be made of, for example, a slightly adhesive resin. The slightly adhesive resin is a resin having weak adhesiveness to the extent that a part can be fixed but the part can be easily peeled off.

In the covering step, first, the plurality of element bodies 2 is arranged on the covering member 62 in a state where the main surface 2a opposes the covering member 62. An interval between the adjacent element bodies 2 is, for example, 1.2 mm. Subsequently, the plurality of element bodies 2 are pressed against the covering member 62, and the chamfered portion 2g and the main surface 2a are embedded to be covered by the covering member 62. A pressing force with respect to the element body 2 is appropriately adjusted depending on a depth of embedding the element body 2 in the covering member 62. In the present embodiment, a part of the chamfered portion 2g, the part adjacent to the main surface 2a, is embedded by the covering member 62, and the pressing force is adjusted to the extent that the remaining parts of the chamfered portion 2g, the parts adjacent to the side surfaces 2c, 2d, 2e, and 2f, are exposed from the covering member 62.

Subsequently, a step of forming the metal shield film 3 on a part including at least the main surface 2b and the side surfaces 2c, 2d, 2e, and 2f and exposed from the covering member 62 of the element body 2 is performed. The metal shield film 3 is formed by sputtering, for example. For example, the plate member 60 is attached to a conveying plate, and the plate member 60 is sequentially conveyed to positions opposing a SUS target for the base layer, a Cu target, and a SUS target for the protective layer, respectively. As a result, the element bodies 2 are sequentially transported together with the plate member 60 to the positions opposing the respective targets in a state where the main surface 2a and a part of the chamfered portion 2g are covered with the covering member 62.

As a result, the metal shield film 3 made of the SUS layer, the Cu layer, and the SUS layer is formed on the part of the element body 2 exposed from the covering member 62. Since the main surface 2a and the part of the chamfered portion 2g are covered with the covering member 62, the metal shield film 3 is not formed on these surfaces. Since the main surface 2b, the side surfaces 2c, 2d, 2e, and 2f, the chamfered portions 2h, 2i, and the remaining parts of the chamfered portion 2g are exposed from the covering member 62, the metal shield film 3 is formed on these surfaces. As a result, the electronic component 1 is formed.

Since it is assumed that the element body 2 is formed in a three-dimensional shape, there is a distribution in thickness of the metal shield film 3 thus formed due to a difference between incident angles of sputtered particles. Since the main surface 2b is disposed in such a way as to oppose a target, a thickness of the metal shield film 3 formed on the main surface 2b is thicker than a thickness of the metal shield film 3 formed on the side surfaces 2c, 2d, 2e, and 2f. The metal shield film 3 may be formed by electrolytic plating, electroless plating, vapor deposition, printing, transferring, or the like.

Subsequently, a step of removing (peeling off) the covering member 62 from the electronic component 1 is performed. Specifically, the adhesive layer of the covering member 62 is cured by UV irradiation to lower the adhesiveness of the adhesive layer. When the adhesive layer is made of the resin having the heat-peelable property, the adhesive layer is heated to lower the adhesiveness of the adhesive layer.

As described above, the element body 2 including the main surface 2a, the main surface 2b, and the side surfaces 2c, 2d, 2e, and 2f on which the terminal electrodes 5 to 7 are formed is prepared in the method of manufacturing the electronic component 1. That is, the main surface 2a and the side surfaces 2c, 2d, 2e, and 2f are adjacent to each other. The chamfered portion 2g that has been chamfered is formed between the main surface 2a and each of the side surfaces 2c, 2d, 2e, and 2f adjacent to each other. The chamfered portion 2g and the main surface 2a are covered with the covering member 62, and the metal shield film 3 is formed on the part of the element body 2 exposed from the covering member 62. Since not only the main surface 2a but also the chamfered portion 2g is covered with the covering member 62, the metal shield film 3 is prevented from being formed to extend to the main surface 2a via the chamfered portion 2g. Therefore, a short circuit between the metal shield film 3 and the terminal electrodes 5 to 7 can be suppressed. Since the main surface 2b and the side surfaces 2c, 2d, 2e, and 2f of the element body 2 are exposed from the covering member 62, the metal shield film 3 can be disposed on the entire main surface 2b and side surfaces 2c, 2d, 2e, and 2f without any gap. As a result, the shielding property can be enhanced.

In the covering step, the part of the chamfered portion 2g adjacent to the main surface 2a is covered with the covering member 62, and the part of the chamfered portion 2g adjacent to the side surfaces 2c, 2d, 2e, and 2f is exposed from the covering member 62. As a result, the metal shield film 3 is also formed on the part of the chamfered portion 2g adjacent to the side surfaces 2c, 2d, 2e, and 2f in the step of forming the metal shield film 3. The surface of the chamfered portion 2g faces the same direction (direction D2 or direction D3) as the side surfaces 2c, 2d, 2e, and 2f in the vicinities of the side surfaces 2c, 2d, 2e, and 2f, and becomes to face the same direction (direction D1) as the main surface 2a as approaching the main surface 2a. Thus, the thickness of the metal shield film 3 formed on the chamfered portion 2g gradually decreases as being separated from the side surfaces 2c, 2d, 2e, and 2f, for example, according to sputtering. Therefore, a contact area between the metal shield film 3 and the covering member 62 decreases by forming the metal shield film 3 at the part of the chamfered portion 2g adjacent to the side surfaces 2c, 2d, 2e, and 2f. As a result, the metal shield film 3 is prevented from being damaged at the time of removing the covering member 62.

The chamfered portion 2g and the main surface 2a can be embedded in the covering member 62 made of the resin having the adhesiveness to be covered in the covering step, and the covering member 62 can be easily removed in the removing step since the adhesiveness of the resin is lowered.

In the covering step, the plurality of element bodies 2 are disposed on the sheet-like covering member 62 in such a way that the chamfered portion 2g and the main surface 2a are covered. In this manner, the chamfered portion 2g and the main surface 2a of the plurality of element bodies 2 are covered simultaneously by the sheet-like covering member 62, and thus, the productivity can be improved.

The present invention is not necessarily limited to the above-described embodiment, and various modifications can be made within a scope not departing from a gist thereof.

Although the description has been given in the above embodiment by exemplifying the high-pass filter, the electronic component 1 may be a high-frequency LC module such as a diplexer and a triplexer, and the number of terminal electrodes is not limited to three. In addition, the present invention may be applied to an electronic component such as a capacitor, an inductor, a varistor, and a thermistor.

Figure 8:
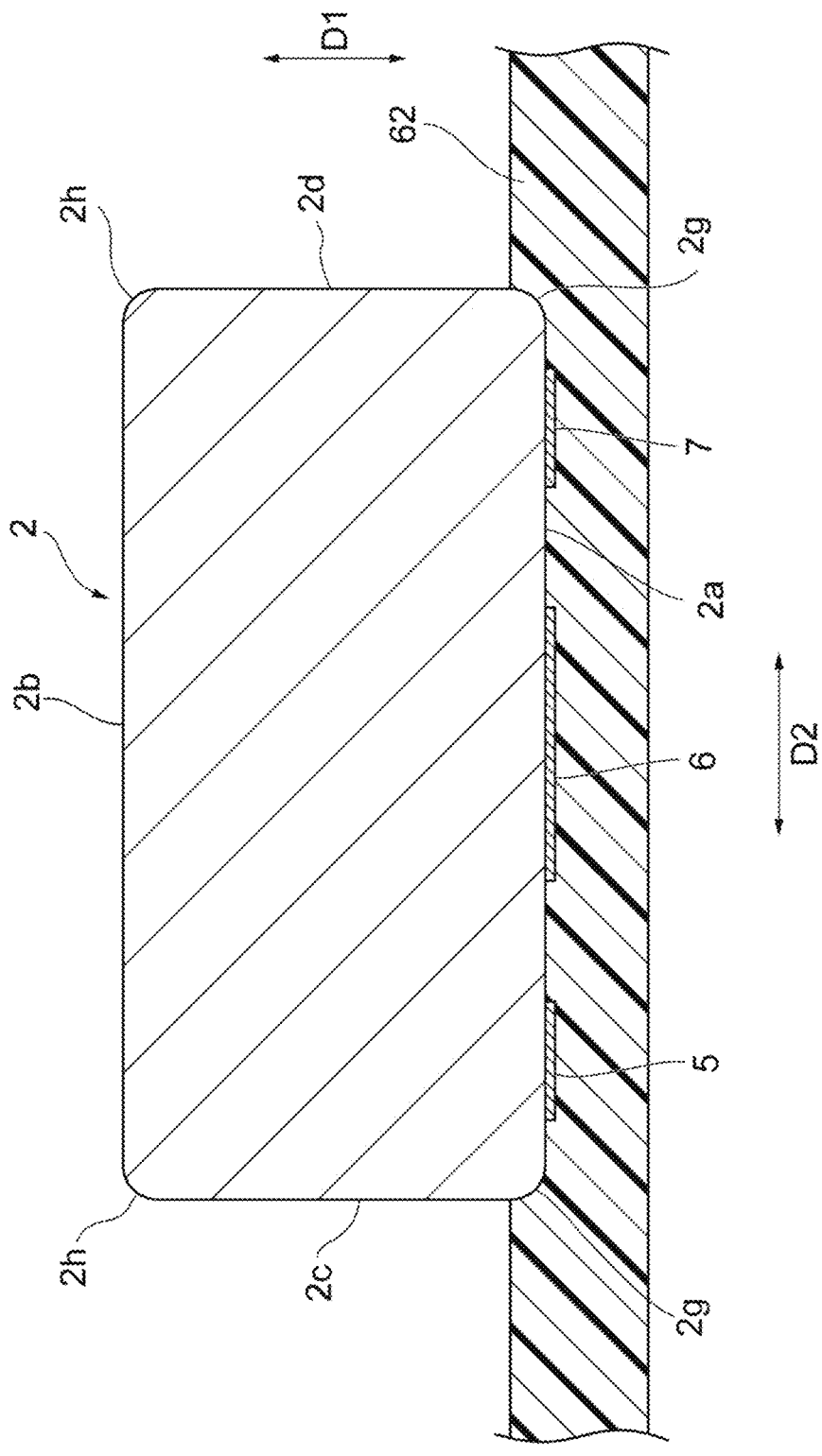
FIG. 8 is a partial cross-sectional view for describing a covering step according to a modification.

FIG. 8 is a partial cross-sectional view for describing a covering step according to a modification. As illustrated in FIG. 8, the whole of the chamfered portion 2g may be covered with the covering member 62 in the covering step. In this case, the whole of the chamfered portion 2g is separated from the metal shield film 3 and exposed from the metal shield film 3 in the electronic component 1. The metal shield film 3 is reliably prevented from being formed to extend to the main surface 2a via the chamfered portion 2g.

The element body 2 of the electronic component 1 has the chamfered portions 2g, 2h, and 2i in the above embodiment, but may have at least the chamfered portion 2g. In the chamfering step, at least the chamfered portion 2g may be formed, and the chamfered portions 2h and 2i are not necessarily formed.

The pattern corresponding to the sintered metal layer of the terminal electrodes 5 to 7 and the pattern corresponding to the mark 8 are formed before the lamination of the green sheets in the above embodiment, but may be formed after the lamination of the green sheets, after the chamfering step or after the step of firing the element body 2. After the step of firing the element body 2, the sintered metal layer of the terminal electrodes 5 to 7 and the mark 8 may be formed by applying a paste containing constituent materials of the conductive paste and the mark 8 on the main surfaces 2a and 2b and baking the paste.

What is claimed is:

1. A method of manufacturing an electronic component, the method comprising:
   preparing an element body configured to have a rectangular parallelepiped shape and include a first surface serving as a mounting surface, a second surface opposing the first surface, and a third surface extending in such a way as to connect the first surface and the second surface;
   forming a chamfered portion chamfered between the first surface and the third surface;
   forming a terminal electrode on the first surface;
   covering the chamfered portion and the first surface with a covering member;
   forming a metal shield film on a part of the element body, the part including at least the second surface and the third surface and exposed from the covering member; and
   removing the covering member.

2. The method of manufacturing an electronic component according to claim 1, wherein
   in the covering, a whole of the chamfered portion is covered with the covering member.

3. The method of manufacturing an electronic component according to claim 1, wherein
   in the covering, a part of the chamfered portion is covered with the covering member, and a remaining part of the chamfered portion is exposed from the covering member.

4. The method of manufacturing an electronic component according to claim 1, wherein
   in the covering, the chamfered portion and the first surface are embedded in the covering member made of a resin having adhesiveness to be covered, and
   in the removing of the covering member, the adhesiveness of the resin is lowered.

5. The method of manufacturing an electronic component according to claim 1, wherein
   in the covering, a plurality of the element bodies is disposed on the covering member having a sheet shape in such a way that the chamfered portion and the first surface are covered.

6. An electronic component comprising:
   an element body configured to have a rectangular parallelepiped shape and include a main surface;
   a terminal electrode disposed on only the main surface; and
   a metal shield film covering the element body,
   wherein the element body includes four side surfaces and curved surfaces between the main surface and the side surfaces,
   the curved surfaces include first parts adjacent to the main surface and second parts adjacent to the side surfaces,
   the main surface and the first parts are exposed from the metal shield film, and
   the second parts are covered by the metal shield film, and
   the curved surfaces are rounded in such a way as to project outward.

7. An electronic component comprising:
   an element body that (1) has a rectangular parallelepiped shape, (2) includes a main surface that is flat and comprises one entire face of the element body, (3) includes four side surfaces that are adjacent and orthogonal to the main surface, each of the four side surfaces comprising a face of the element body, and (4) includes curved surfaces (a) with a radius of curvature extending away from a center portion of the element body and (b) that directly connect the main surface and the four side surfaces;
   a terminal electrode on only the main surface; and
   a metal shield film; wherein:
   the curved surfaces include first parts that are continuous with the main surface and second parts that are continuous with the four side surfaces;
   the metal shield film covers the four side surfaces and the second parts; and
   the metal shield film does not cover the main surface and the first parts.

* * * * *